United States Patent
Yoo et al.

(10) Patent No.: US 10,103,038 B1
(45) Date of Patent: Oct. 16, 2018

(54) THRUMOLD POST PACKAGE WITH REVERSE BUILD UP HYBRID ADDITIVE STRUCTURE

(71) Applicant: Micron Technology, Inc., Boise, ID (US)

(72) Inventors: Chan H. Yoo, Boise, ID (US); John F. Kaeding, Boise, ID (US); Ashok Pachamuthu, Boise, ID (US); Mark E. Tuttle, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/685,921

(22) Filed: Aug. 24, 2017

(51) Int. Cl.
| | |
|---|---|
| *H01L 21/00* | (2006.01) |
| *H01L 21/56* | (2006.01) |
| *H01L 23/31* | (2006.01) |

(52) U.S. Cl.
CPC .......... *H01L 21/566* (2013.01); *H01L 21/563* (2013.01); *H01L 23/3128* (2013.01); *H01L 2224/04105* (2013.01); *H01L 2224/12105* (2013.01); *H01L 2224/16225* (2013.01); *H01L 2924/15311* (2013.01)

(58) Field of Classification Search
None
See application file for complete search history.

(56) References Cited

U.S. PATENT DOCUMENTS

| | | | | |
|---|---|---|---|---|
| 9,040,408 B1* | 5/2015 | Zhou | ...... | H01L 24/11 257/780 |
| 9,324,687 B1* | 4/2016 | Kelkar | ...... | H01L 25/50 |
| 2005/0029644 A1* | 2/2005 | Ho | ...... | H01L 23/5389 257/686 |
| 2005/0242422 A1* | 11/2005 | Klein | ...... | H01L 21/563 257/686 |
| 2009/0008762 A1* | 1/2009 | Jung | ...... | H01L 23/5389 257/686 |
| 2011/0068427 A1* | 3/2011 | Paek | ...... | H01L 24/19 257/433 |
| 2011/0186977 A1* | 8/2011 | Chi | ...... | H01L 21/78 257/686 |

(Continued)

OTHER PUBLICATIONS

Pachamuthu, A. et al., Unpublished United States Patent Application entitled "Hybrid Additive Structure Stackable Memory Die Using Wire Bond", filed Aug. 24, 2017, 31 pages.

*Primary Examiner* — Angel Roman
(74) *Attorney, Agent, or Firm* — Perkins Coie LLP (57) ABSTRACT

Semiconductor devices having a semiconductor die electrically coupled to a redistribution structure and a molded material over the redistribution structure are disclosed herein, along with associated systems and methods. In one embodiment, a semiconductor device includes a semiconductor die attached to a first side of a substrate-free redistribution structure, and a plurality of conductive columns extending through a molded material disposed on the first side of the redistribution structure. The semiconductor device can also include a second redistribution structure on the molded material and electrically coupled to the conductive columns. A semiconductor device can be manufactured using a single carrier and requiring processing on only a single side of the semiconductor device.

25 Claims, 5 Drawing Sheets

(56) References Cited

U.S. PATENT DOCUMENTS

| | | | | |
|---|---|---|---|---|
| 2012/0256280 A1* | 10/2012 | Erhart | ................... | H01L 21/561 |
| | | | | 257/414 |
| 2013/0105966 A1* | 5/2013 | Kelkar | ................... | H01L 24/19 |
| | | | | 257/737 |
| 2014/0264817 A1* | 9/2014 | Lee | ................. | H01L 25/50 |
| | | | | 257/712 |
| 2017/0033062 A1* | 2/2017 | Liu | ................. | H01L 23/66 |

* cited by examiner

THRUMOLD POST PACKAGE WITH REVERSE BUILD UP HYBRID ADDITIVE STRUCTURE

CROSS-REFERENCE TO RELATED APPLICATION(S)

This application contains subject matter related to a concurrently-filed U.S. Patent Application by John F. Kaeding, Ashok Pachamuthu, and Chan H. Yoo, entitled "HYBRID ADDITIVE STRUCTURE STACKABLE MEMORY DIE USING WIRE BOND." The related application, of which the disclosure is incorporated by reference herein, is assigned to Micron Technology, Inc., and is identified by Ser. No. 15/685,940.

TECHNICAL FIELD

The present disclosure generally relates to semiconductor devices. In particular, the present technology relates to semiconductor devices having a semiconductor die electrically coupled to a redistribution structure and a molded material over the redistribution structure, and associated systems and methods.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, dies are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

Different types of dies may have widely different bond pad arrangements, and yet should be compatible with similar external devices. Accordingly, existing packaging techniques can include forming a redistribution layer (RDL) on the die. The RDL includes lines and/or vias that connect the die bond pads with RDL bond pads, which are in turn arranged to mate with the bond pads of external devices. In one typical packaging process, many dies are mounted on a carrier (i.e., at a wafer or panel level) and encapsulated before the carrier is removed. The processed device is then flipped over and/or attached to a second carrier so that an RDL can be formed directly on a front side of the dies using deposition and lithography techniques. Finally, an array of leads, ball-pads, or other types of electrical terminals are mounted on bond pads of the RDL and the processed device is singulated to form individual devices.

One drawback with the foregoing packaging technique is that it requires multiple stages of moving the processed device (e.g., flipping the device and/or attaching it to a second carrier). Each additional stage increases the cost of manufacturing and the risk of damage during the manufacturing process (i.e., yield loss).

DETAILED DESCRIPTION

Specific details of several embodiments of semiconductor devices having a semiconductor die electrically coupled to a redistribution structure and a molded material over the redistribution structure are described below. In some embodiments, a semiconductor device includes a semiconductor die attached to a first side of a redistribution structure and encapsulated by a molded material. The device includes conductive columns extending through the molded material from contacts on the redistribution structure. In certain embodiments of associated methods, a semiconductor device can be manufactured using a single temporary carrier and with processing on only a single side of the device. In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As used herein, the terms "vertical," "lateral," "upper," and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 1:
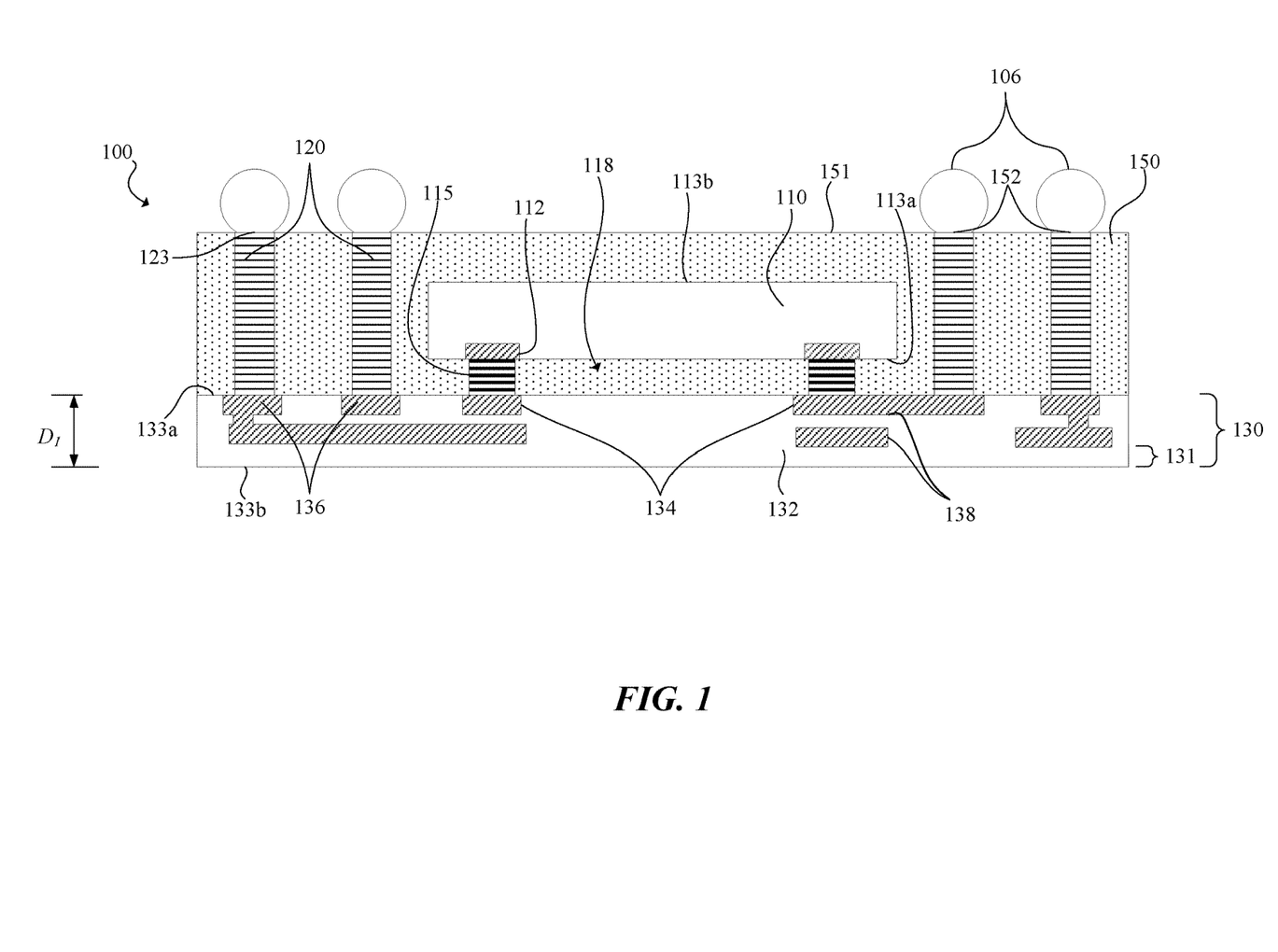
FIG. 1 is a cross-sectional view illustrating a semiconductor device in accordance with an embodiment of the present technology.

FIG. 1 is a cross-sectional view illustrating a semiconductor device 100 ("device 100") in accordance with an embodiment of the present technology. The device 100 can include a semiconductor die 110 coupled to a redistribution structure 130. The semiconductor die 110 includes a plurality of bond pads 112 exposed at a front side 113a thereof. The semiconductor die 110 die can have integrated circuits or components, data storage elements, processing components, and/or other features manufactured on semiconductor substrates. For example, the semiconductor die 110 can include integrated circuit memory and/or logic circuitry, and can include various types of semiconductor components and functional features, such as dynamic random-access memory (DRAM), static random-access memory (SRAM), flash memory, other forms of integrated circuit memory, processing circuits, imaging components, and/or other semiconductor features. As shown in FIG. 1, the device 100 includes only a single semiconductor die 110. However, in other embodiments the device 100 may include any number of semiconductor dies. For example, the device 100 may include one or more additional semiconductor dies stacked on the semiconductor die 110 and/or disposed adjacent to the semiconductor die 110 on the redistribution structure 130.

The redistribution structure 130 includes a dielectric material 132 having a first surface 133a and a second surface 133b opposite the first surface 133a. The redistribution structure 130 also includes first contacts 134 in and/or on the dielectric material 132, and second contacts 136 in and/or on the dielectric material 132. The semiconductor die 110 is coupled to the first surface 133a of the redistribution structure 130, and the first and second contacts 134 and 136 are exposed at the first surface 133a. As shown in FIG. 1, the first contacts 134 can be positioned on the first surface 133a in a die-attach area so that they are at least partly under the semiconductor die 110. The second contacts 136 can be spaced peripherally away from the first contacts 134 (e.g., fanned out from or positioned outboard of the first contacts 134), and therefore not positioned under the semiconductor die 110. The redistribution structure 130 further includes a plurality of conductive lines 138 (e.g., vias and/or traces) extending within and/or on the dielectric material 132 to electrically couple individual ones of the first contacts 134 to corresponding ones of the second contacts 136. In certain embodiments, the first contacts 134, second contacts 136, and conductive lines 138 can be formed from one or more conductive materials such as copper, nickel, solder (e.g., SnAg-based solder), conductor-filled epoxy, and/or other electrically conductive materials.

In some embodiments, the dielectric material 132 of the redistribution structure 130 can comprise one or more layers of a suitable dielectric or passivation material, and the dielectric material 132 electrically isolates individual first contacts 134, second contacts 136, and associated conductive lines 138 from one another. The redistribution structure 130 further includes an insulating layer 131 of the dielectric material 132 that defines the second surface 133b of the redistribution structure 130. No electrical contacts or other conductive elements are disposed in the insulating layer 131. As a result, the semiconductor die 110 and/or other components of the device 100 are not electrically accessible from the second surface 133b of the redistribution structure 130, and are consequently not accessible from a lowermost side of the device 100.

The redistribution structure 130 does not include a pre-formed substrate (e.g., a laminate or organic substrate) and can therefore be made very thin. For example, in some embodiments, a distance $D_1$ between the first and second surfaces 133a and 133b of the redistribution structure 130 is less than 50 µm. In certain embodiments, the distance $D_1$ is approximately 30 µm, or less than 30 µm. However, the thickness of the redistribution structure 130 is not limited. In other embodiments, the redistribution structure 130 can include different features and/or the features can have a different arrangement.

The device 100 further includes a plurality of conductive features 115 coupling the bond pads 112 of the semiconductor die 110 to corresponding ones of the first contacts 134 of the redistribution structure 130. The conductive features 115 can have various suitable structures, such as pillars, columns, studs, bumps, etc., and can be made from copper, nickel, solder (e.g., SnAg-based solder), conductor-filled epoxy, and/or other electrically conductive materials. In certain embodiments, the conductive features 115 are solder-joints. In selected embodiments, the conductive features 115 can be copper pillars, whereas in other embodiments the conductive features 115 can include more complex structures, such as bump-on-nitride structures. In some embodiments, the conductive features 115 have a height above the redistribution structure 130 such that the device 100 includes a gap 118 formed interstitially between the semiconductor die 110 and the first surface 133a of the redistribution structure 130.

As shown in FIG. 1, the device 100 also includes a plurality of conductive columns 120 electrically coupled to the second contacts 136 of the redistribution structure 130. The conductive columns 120 extend upward in the illustrated orientation and away from the first surface 133a of the redistribution structure 130, and they can be made from copper, nickel, solder (e.g., SnAg-based solder), conductor-filled epoxy, and/or other electrically conductive materials. In the illustrated embodiment, the conductive columns 120 extend upward above the elevation of a back side 113b of the semiconductor die 110. That is, the conductive columns 120 can have a height above the first surface 133a of the redistribution structure 130 that is greater than a height of the semiconductor die 110 above the first surface 133a of the redistribution structure 130. In other embodiments, the height of the conductive columns 120 can be equal to, or less than, the height of the semiconductor die 110. Accordingly, the height of the conductive columns 120 can be greater than a height of the conductive features 115 above the first surface 133a of the redistribution structure 130. Moreover, a terminus 123 (e.g., the end opposite the second contacts 136 of the redistribution structure 130) of each of the conductive columns 120 can collectively define a plurality of third contacts 152. The third contacts 152 can be exposed at an upper surface 151 of a molded material 150.

The molded material 150 can be formed over at least a portion of the first surface 133a of the redistribution structure 130 and can at least partly surround the semiconductor die 110 and/or the conductive columns 120. In some embodiments, the molded material 150 can encapsulate the semiconductor die 110 to thereby protect the semiconductor die 110 from contaminants and physical damage. In certain embodiments, the molded material 150 at least partly fills the gap 118 between the front side 113a of the semiconductor die 110 and the first surface 133a of the redistribution structure 130. In such embodiments, the molded material 150 can function to strengthen the coupling between the semiconductor die 110 and the redistribution structure 130, and to help prevent bending, warping, etc. of the semiconductor die 110 as external forces are applied to the device 100. Moreover, since the redistribution structure 130 does not include a pre-formed substrate, the molded material 150 can function to give the device 100 a desired structural strength. For example, the molded material 150 can be selected to prevent the device 100 from bending, warping, etc. as external forces are applied to the device 100. As a result, in some embodiments, the redistribution structure 130 can be made very thin (e.g., less than 50 µm or less than 30 µm) since the redistribution structure 130 need not provide the device 100 with a great deal of structural strength. Therefore, the overall size (e.g., height) of the device 100 can be reduced.

The device 100 can further include a plurality of electrical connectors 106 disposed on the third contacts 152. The electrical connectors 106 can be solder balls, conductive bumps, conductive pillars, conductive epoxies, and/or other suitable electrically conductive elements, and can be electrically coupled to external circuitry (not shown). In some embodiments, the electrical connectors 106 form a ball grid array on the third contacts 152 at the upper surface 151 of the molded material 150. The ball grid array can be a perimeter ball grid array in which the electrical connectors 106 are all spaced peripherally away from (e.g., positioned outboard of) the semiconductor die 110. That is, the electrical connectors 106 are not positioned above the semiconductor die 110. In some embodiments (e.g., as described below with reference to FIGS. 2A and 2B), a second redistribution structure can be formed on the upper surface 151 of the molded material 150 and used to distribute the electrical connectors 106 in different arrangements (e.g., a "fanned-in" or other arrangement having greater space between adjacent ones of the electrical connectors 106 than in the perimeter ball grid array embodiment). In other embodiments, the electrical connectors 106 can be omitted and the third contacts 152 can be directly connected to external devices or circuitry.

Figure 2A:
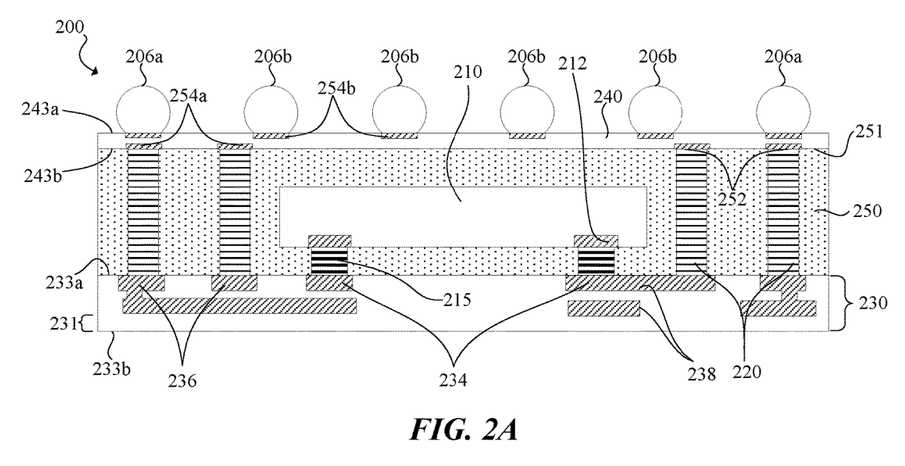
FIGS. 2A and 2B are a cross-sectional view and a top plan view, respectively, illustrating a semiconductor device in accordance with an embodiment of the present technology.
Figure 2B:
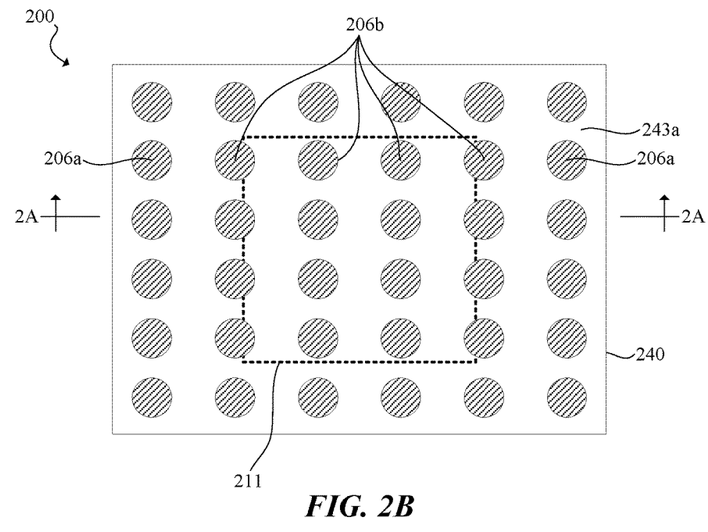

FIG. 2A is a cross-sectional view, and FIG. 2B is a top plan view, illustrating a semiconductor device 200 ("device 200") in accordance with another embodiment of the present technology and including a second redistribution structure. The device 200 can include features generally similar to those of the device 100 described in detail above. For example, in the embodiment illustrated in FIG. 2A, the device 200 includes a first redistribution structure 230 having an upper surface 233*a* and a lower surface 233*b*, and a semiconductor die 210 coupled to the upper surface 233*a* of the first redistribution structure 230. The first redistribution structure 230 can include first contacts 234 electrically coupled to bond pads 212 of the semiconductor die 210 via conductive features 215. The first contacts 234 can be electrically coupled via conductive lines 238 to corresponding ones of second contacts 236 that are positioned outboard of the first contacts 234. Additionally, the device 200 can include conductive columns 220 that extend upward from the second contacts 236 of the first redistribution structure 230. The conductive columns 220 can each have an upper end portion collectively defining a plurality of third contacts 252. The third contacts 252 can be exposed at an upper surface 251 of a molded material 250, wherein the molded material 250 is disposed over the upper surface 233*a* of the first redistribution structure 230 and at least partly surrounds the semiconductor die 210 and/or conductive columns 220.

The device 200 can further include a second redistribution structure 240 over the upper surface 251 of the molded material 250 and the third contacts 252. The second redistribution structure 240 can have generally similar features to the first redistribution structure 230, and the redistribution structure 130 described above with reference to FIG. 1. For example, the second redistribution structure 240 can be an additive structure comprising one or more conductive layers (e.g., conductive traces, lines, vias, etc.) and one or more insulative layers. More specifically, the second redistribution structure 240 can include a lower surface 243*b* abutting the upper surface 251 of the molded material 250 and the third contacts 252, and an upper surface 243*a* opposite the lower surface 243*b*.

The second redistribution structure 240 can have a plurality of fourth contacts 254*a* exposed at the lower surface 243*b*, and a plurality of fifth contacts 254*b* exposed at the upper surface 243*a*. The fourth contacts 254*a* can be electrically coupled to corresponding ones of the third contacts 252 (e.g., positioned on or adjacent the third contacts 252) to provide an electrical coupling between the conductive columns 220 and the second redistribution structure 240. The fifth contacts 254*b* can be electrically coupled to corresponding ones of the fourth contacts 254*a* through conductive elements in and/or on the second redistribution structure 240. More specifically, conductive elements of the second redistribution structure 240 (e.g., a plurality of conductive traces, vias, etc.) can extend in, on, and/or through a dielectric material of the second redistribution structure 240 to electrically couple the fourth contacts 254*a* to corresponding ones of the fifth contacts 254*b*. As shown in FIG. 2A, in some embodiments, one or more of the fourth contacts 254*a* can be positioned outboard (e.g., spaced laterally farther from the semiconductor die 210) than at least some of the fifth contacts 254*b*. In one embodiments, all of the fourth contacts 254*a* can be positioned outboard of the fifth contacts 254*b*. A plurality of electrical connectors 206 (e.g., solder balls, conductive bumps, conductive pillars, conductive epoxies, etc.) can be disposed on the fifth contacts 254*b* and are configured to be electrically coupled to external circuitry (not shown).

In some embodiments, the conductive columns 220 project beyond the upper surface 251 of the molded material 250 and into the second redistribution structure 240. In some such embodiments, the device 200 may not include separate or distinct third contacts 252 and fourth contacts 254*a*. In other embodiments, the conductive columns 220 can extend completely through both the molded material 250 and the dielectric material of the second redistribution structure 240 such that the upper end portions of one or more of the conductive columns 220 can be exposed at the upper surface 243*a* of the second redistribution structure 240 to define a fifth contact 254*b*. Accordingly, unlike the first redistribution structure 230—which includes an insulating layer 231 of dielectric material along an entire lower surface 233*b* of the first redistribution structure 230—the second redistribution structure 240 does not include an insulating layer electrically isolating either the lower surface 243*b* or the upper surface 243*a*. The second redistribution structure 240 is therefore electrically accessible at both surfaces.

In some embodiments, the second redistribution structure 240 has a thickness (defined as a distance between the upper surface 243*a* and the lower surface 243*b*) that is smaller than a thickness of the first redistributions structure 230 (defined as a distance between the upper surface 233*a* and the lower surface 233*b*). For example, the second redistribution structure 240 can include only one layer of conductive and/or insulative materials, while the first redistribution structure 230 can include more than one layer of conductive and/or insulative materials. In other embodiments, the first and second redistribution structures 230, 240 can have the same structure, or the thickness of the second redistribution structure 240 can be greater than the thickness of the first redistribution structure 230.

In operation, the second redistribution structure 240 redistributes the third contacts 252 of the conductive columns 220 inward over the semiconductor die 210 to form a more widely-spaced array of fifth contacts 254*b* so that, for example, a full ball grid array can be formed on the device 200. More specifically, FIG. 2B is a top plan view of the device 200 that schematically shows an embodiment of the placement of the electrical connectors 206 on the upper surface 243*a* of the second redistribution structure 240. As shown, the electrical connectors 206 can be generally aligned in rows and columns to form an array (e.g., a ball grid array). In other embodiments, the fifth contacts 254*b* can be formed such that the electrical connectors 206 can have any other suitable positioning and alignment (e.g., in off-set rows or columns, in a concentric pattern, non-evenly spaced, etc.). The second redistribution structure 240 allows for some of the fifth contacts 254b to be positioned within a footprint 211 of the semiconductor die 210 (i.e., above the semiconductor die 210). For example, as shown in FIG. 2B, a plurality of electrical connectors 206b are positioned at least partly within the footprint 211, while a plurality of electrical connectors 206a are spaced outboard of the footprint 211. As such, the second redistribution structure 240 redistributes the peripheral third contacts 252 of the conductive columns 220 inward to provide a more widely-spaced interface for connecting the device 200 to external circuitry (e.g., compared to a peripheral array, such as the embodiment shown in FIG. 1).

FIGS. 3A-3G are cross-sectional views illustrating various stages in a method of manufacturing semiconductor devices 200 in accordance with embodiments of the present technology. Generally, a semiconductor device 200 can be manufactured, for example, as a discrete device or as part of a larger wafer or panel. In wafer-level or panel-level manufacturing, a larger semiconductor device is formed before being singulated to form a plurality of individual devices in a final stage. For ease of explanation and understanding, FIGS. 3A-3G illustrate the fabrication of two semiconductor devices 200. However, one skilled in the art will readily understand that the fabrication of semiconductor devices 200 can be scaled to the wafer and/or panel level—that is, to include many more components so as to be capable of being singulated into more than two semiconductor devices 200—while including similar features and using similar processes as described herein. Moreover, the same or a substantially similar method can be used to manufacture one or more semiconductor devices 100, except where differences are noted below.

Figure 3A:
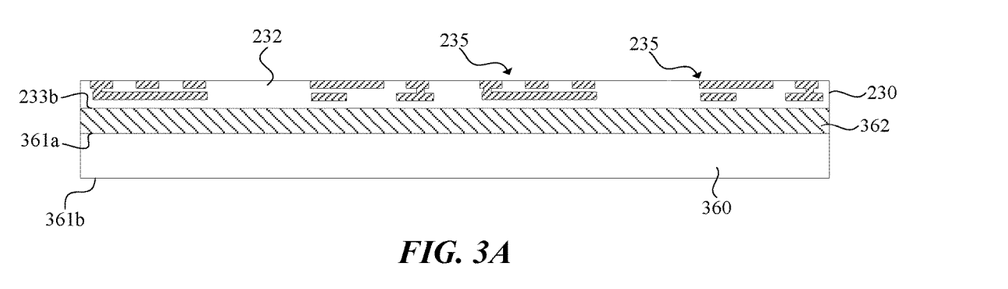
FIGS. 3A-3G are cross-sectional views illustrating a semiconductor device at various stages of manufacturing a semiconductor device in accordance with an embodiment of the present technology.

Referring first to FIG. 3A, fabrication of the semiconductor devices 200 begins with the formation of a redistribution structure before the semiconductor dies 210 are attached. A carrier 360 having a front side 361a and a back side 361b is provided, and a release layer 362 is formed on the front side 361a of the carrier 360. The first redistribution structure 230 is formed on the release layer 362. The release layer 362 provides easy removal of the carrier 360 from the first redistribution structure 230 in a later stage of manufacturing and prevents direct contact of the first redistribution structure 230 with the carrier 360 to protect the first redistribution structure 230 from possible contaminants on the carrier 360. In certain embodiments, the carrier 360 can be a temporary carrier formed from, e.g., silicon, silicon-on-insulator, compound semiconductor (e.g., Gallium Nitride), glass, or other suitable materials. In part, the carrier 360 provides mechanical support for downstream processing stages, and also protects a surface of the release layer 362 during the downstream processing stages to ensure that the first redistribution structure 230 can be removed from the release layer 362. In some embodiments, the carrier 360 can be reused after it is subsequently removed. The release layer 362 can be a disposable film (e.g., a laminate film of epoxy-based material) or other suitable material.

The first redistribution structure 230 is a hybrid structure of conductive and dielectric materials that can be formed from an additive build-up process. That is, the first redistribution structure 230 is additively built directly on the carrier 360 and release layer 362 rather than on a pre-formed laminate or organic substrate. Specifically, the first redistribution structure 230 is fabricated by semiconductor wafer fabrication processes such as sputtering, physical vapor deposition (PVD), electroplating, lithography, etc. A dielectric material 232 of the redistribution structure may comprise one or more layers, and may be formed from, for example, parylene, polyimide, low temperature chemical vapor deposition (CVD) materials—such as tetraethylorthosilicate (TEOS), silicon nitride ($Si_3Ni_4$), silicon oxide ($SiO_2$)—and/or other suitable dielectric, non-conductive materials. Notably, the lower surface 233b of the first redistribution structure 230 is formed to comprise only the dielectric material 232. Therefore, the dielectric material 232 defines the lower surface 233b of the first redistribution structure 230 such that the first redistribution structure 230 is electrically inaccessible from the lower surface 233b. The first redistribution structure 230 includes conductive portions 235 such as the first contacts 234, second contacts 236, and conductive lines 238 shown in FIG. 2A, which can be made from copper, nickel, solder (e.g., SnAg-based solder), conductor-filled epoxy, and/or other electrically conductive materials. In some embodiments, the conductive portions 235 are all made from the same conductive material. In other embodiments, the first contacts 234, second contacts 236, and/or conductive lines 238 can comprise one or more conductive materials, and/or different conductive portions 235 can comprise different conductive materials.

Figure 3B:
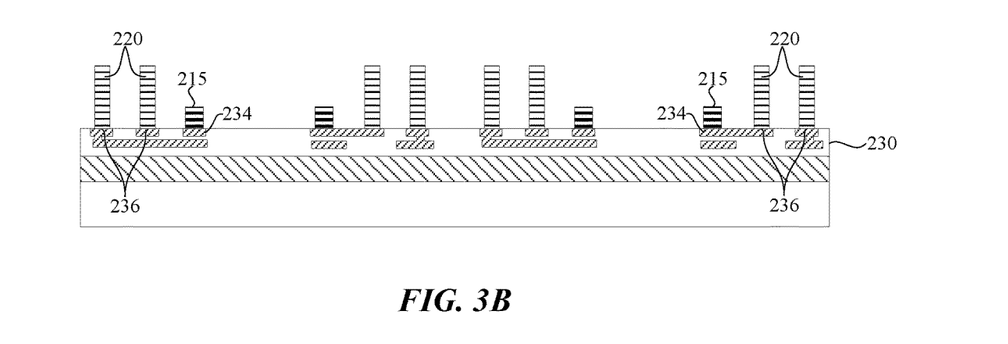

Referring to FIG. 3B, fabrication of the semiconductor devices 200 continues with the formation of the conductive features 215 on the first contacts 234 of the first redistribution structure 230, and formation of the conductive columns 220 on the second contacts 236 of the first redistribution structure 230. The conductive columns 220 are formed such that they have a height that is greater than a height of the conductive features 215. In some embodiments, the conductive features 215 and the conductive columns 220 can be formed as part of the same process. For example, in certain embodiments, the conductive features 215 and conductive columns 220 can be fabricated by a suitable electroplating process, as is well known in the art. In other embodiments, other deposition techniques (e.g., sputter deposition) can be used in lieu of electroplating. In yet other embodiments, the conductive features 215 and/or conductive columns 220 can be formed from a different process and/or at different times. For example, the conductive features 215 may comprise solder balls or solder bumps disposed on the first contacts 234, whereas the conductive columns 220 are electroplated on the second contacts 236. Moreover, the conductive features 215 and conductive columns 220 can have a circular, rectangular, hexagonal, polygonal, or other cross-sectional shape, and can be single layer or multi-layer structures.

Figure 3C:
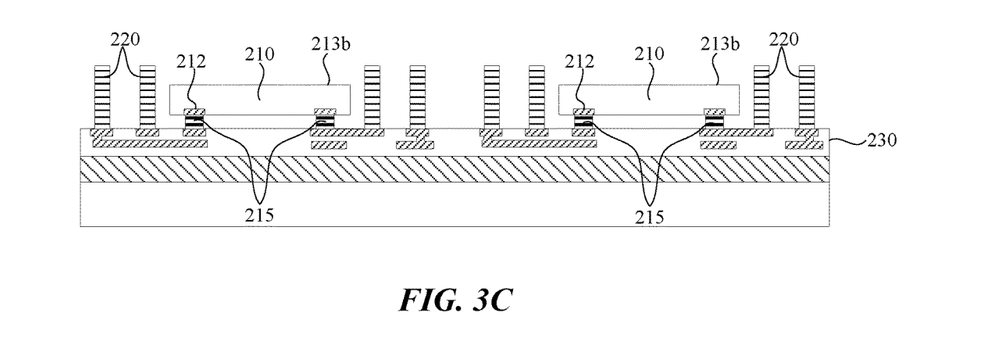

Turning to FIG. 3C, fabrication of the semiconductor devices 200 continues with the electrical coupling of the semiconductor dies 210 to the conductive features 215. More specifically, the semiconductor dies 210 can be flip-chipped bonded to the first redistribution structure 230 such that the bond pads 212 of the semiconductor dies 210 are electrically coupled to corresponding ones of the first contacts 234 of the first redistribution structure 230 via the conductive features 215. In some embodiments, the bond pads 212 are coupled to the conductive features 215 using solder or a solder paste. In other embodiments, another process such as thermo-compression bonding (e.g., copper-copper (Cu—Cu) bonding) can be used to form conductive solder joints between the bond pads 212 and the conductive features 215. As shown in FIG. 3C, the conductive columns 220 can be formed so as to extend past an elevation of an upper surface 213b of the semiconductor dies 210. In other embodiments, the conductive columns 220 can be formed to have a height equal to a height of the semiconductor dies 210

(i.e., upper end portions of the conductive columns 220 can be generally coplanar with the upper surfaces 213b of the semiconductor dies 210).

Figure 3D:
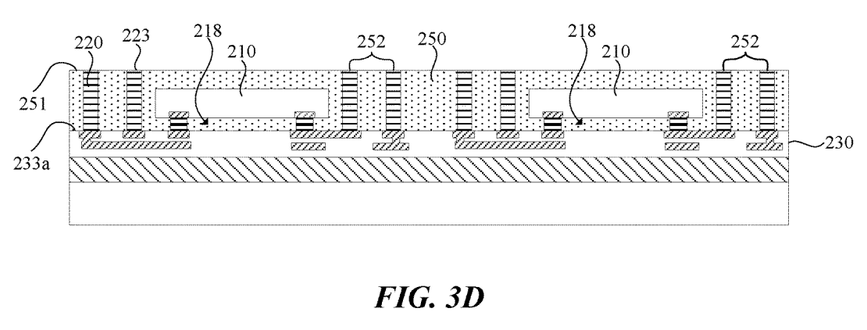

Referring to FIG. 3D, fabrication of the semiconductor devices 200 continues with disposing the molded material 250 over the upper surface 233a of the first redistribution structure 230 and at least partly around the semiconductor dies 210 and conductive columns 220. The molded material 250 may be formed from a resin, epoxy resin, silicone-based material, polyimide, and/or other suitable resin used or known in the art. Once deposited, the molded material 250 can be cured by UV light, chemical hardeners, heat, or other suitable curing methods known in the art. The molded material 250 can be at least partially disposed in an interstitial gap 218 between each semiconductor die 210 and the upper surface 233a of the first redistribution structure 230. The molded material 250 can therefore eliminate a separate underfill material and strengthen the coupling between the semiconductor die 210 and the first redistribution structure 230. Moreover, at least a terminus 223 each conductive column 220 can be exposed at the upper surface 251 of the molded material 250. The termini 223 of the conductive columns 220 collectively define the third contacts 252. In some embodiments, the molded material 250 is formed in one step such that the third contacts 252 are exposed at the upper surface 251 of the molded material 250. In other embodiments, the molded material 250 is formed and then ground back to planarize the upper surface 251 and to thereby expose the third contacts 252 of the conductive columns 220. As further shown in FIG. 3D, in some embodiments, the molded material 250 encapsulates the semiconductor dies 210 such that semiconductor dies 210 are sealed within the molded material 250.

Figure 3E:
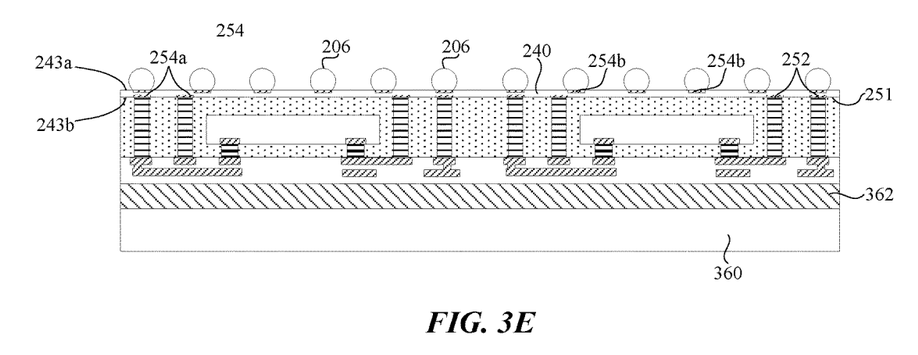

Turning to FIG. 3E, fabrication of the semiconductor devices 200 continues with forming the second redistribution structure 240 and electrically coupling the electrical connectors 206 to the second redistribution structure 240. In particular, the second redistribution structure 240 is formed over the upper surface 251 of the molded material 250 and the third contacts 252 of the conductive columns 220. The second redistribution structure 240 can be formed by a generally similar process as the first redistribution structure 230. For example, the second redistribution structure 240 can be a hybrid structure of conductive and dielectric materials formed from an additive build-up process. However, unlike the first redistribution structure 230, the second redistribution structure 240 does not include only an insulating layer on a lower surface 243b and is therefore electrically accessible at both the upper and lower surfaces 243a and 243b. For example, conductive portions (e.g., the fourth contacts 254a, conductive traces, vias, etc.) extending in and/or on the dielectric material of the second redistribution structure 240 can electrically couple the third contacts 252 of the conductive columns 220 to corresponding ones of package contacts 254 (e.g., the fifth contacts 254b) exposed at the upper surface 243a of the second redistribution structure 240.

The electrical connectors 206 are configured to electrically couple the package contacts 254 of the second redistribution structure 240 to external circuitry (not shown). In some embodiments, the electrical connectors 206 comprise a plurality of solder balls or solder bumps. For example, a stenciling machine can deposit discrete blocks of solder paste onto the package contacts 254 of the second redistribution structure 240. The solder paste can then reflowed to form solder balls or solder bumps on the package contacts 254. In embodiments where the semiconductor devices 200 include only the first redistribution structure 230 (e.g., as in the embodiment shown in FIG. 1), the electrical connectors 206 can be formed directly on the exposed third contacts 252 of the conductive columns 220.

Figure 3F:
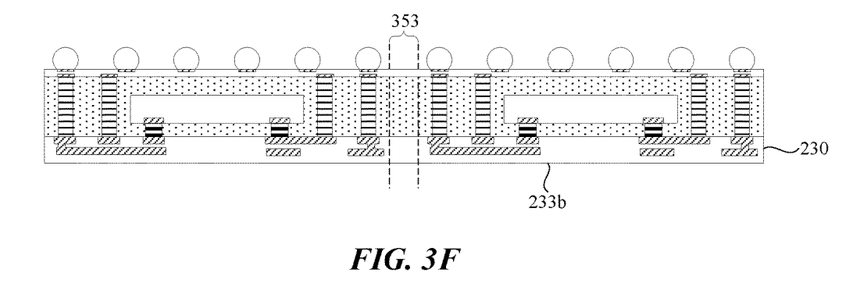

Turning to FIG. 3F, fabrication of the semiconductor devices 200 continues with separating the first redistribution structure 230 from the carrier 360. In some embodiments, the release layer 362 allows the carrier 360 to be easily removed from the first redistribution structure 230 via a vacuum, poker pin, or other suitable method such that the carrier 360 can be reused again. In other embodiments, the carrier 360 and release layer 362 can also be removed using grinding techniques or otherwise removing the carrier 360 and release layer 362 (e.g., back grinding, dry etching processes, chemical etching processes, chemical mechanical polishing (CMP), etc.). Removing the carrier 360 and release layer 362 exposes the electrically-insulated lower surface 233b of the first redistribution structure 230. As further shown in FIG. 3F, singulating lanes 353 can be provided between adjacent semiconductor devices 200, to facilitate the singulation thereof.

Figure 3G:
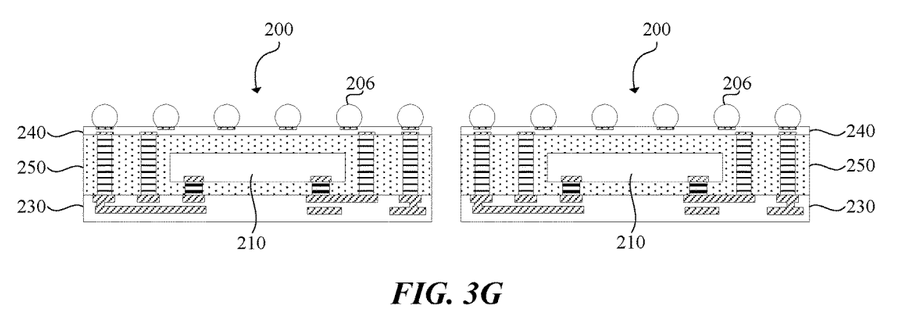

FIG. 3G shows the semiconductor devices 200 after being singulated from one another. Specifically, the first redistribution structure 230, molded material 250, and second redistribution structure 240 can be cut together at the singulating lanes 353 (illustrated in FIG. 3F) to separate the semiconductor devices 200 from one another. In embodiments where the semiconductor devices 200 include only a single redistribution structure 230 (e.g., as in the embodiment shown in FIG. 1), only the molded material 250 and the first redistribution structure 230 are cut at the singulating lanes 353 to singulate individual semiconductor devices (e.g., semiconductor devices 100). Once singulated, the individual semiconductor devices 200 can be attached to external circuitry via the electrical connectors 206 and thus incorporated into a myriad of systems and/or devices.

The method illustrated with reference to FIGS. 3A-3G utilizes only a single carrier 360 and requires processing on only a single (e.g., upper) side of the semiconductor devices 200. More specifically, single-side and single-carrier processing stages are achieved by forming the first redistribution structure 230 on the carrier 360 before mounting the semiconductor dies 210, and by forming conductive columns 220 that are tall enough to extend through the molded material 250 and that can be electrically coupled to package contacts (e.g., the third contacts 252, or the package contacts 254 of the second redistribution structure 240) positioned on an uppermost side of the semiconductor device 200. Accordingly, the cost, time, and complexity of manufacturing a semiconductor device (e.g., semiconductor device 100 or 200 as described herein) can be reduced as compared to other methods that require two-sided processing and/or multiple carriers.

Figure 4:
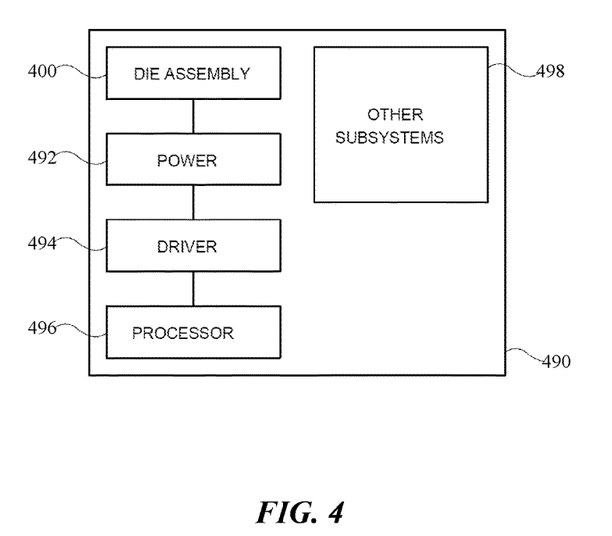
FIG. 4 is a schematic view of a system that includes a semiconductor device configured in accordance with an embodiment of the present technology.

Any one of the semiconductor devices described above with reference to FIGS. 1-3 can be incorporated into any of a myriad of larger and/or more complex systems, a representative example of which is system 490 shown schematically in FIG. 4. The system 490 can include a semiconductor die assembly 400, a power source 492, a driver 494, a processor 496, and/or other subsystems or components 498. The semiconductor die assembly 400 can include semiconductor devices with features generally similar to those of the semiconductor devices described above. The resulting system 490 can perform any of a wide variety of functions, such as memory storage, data processing, and/or other suitable functions. Accordingly, representative systems 490 can include, without limitation, hand-held devices (e.g., mobile phones, tablets, digital readers, and digital audio players), computers, and appliances. Components of the system 490 may be housed in a single unit or distributed over multiple, interconnected units (e.g., through a communications network). The components of the system 590 can also include remote devices and any of a wide variety of computer readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device, comprising:
   a redistribution structure having a first side and a second side, wherein the first side includes first conductive contacts and second conductive contacts, wherein the first conductive contacts are electrically coupled to corresponding ones of the second conductive contacts, wherein the second side comprises a continuous layer of insulating material without any conductors therein, and wherein the redistribution structure does not include a pre-formed substrate;
   a semiconductor die positioned over the first side and electrically coupled to the first conductive contacts;
   a molded material on the first side; and
   conductive columns extending from the first side and at least partially through the molded material and electrically coupled to corresponding ones of the second conductive contacts.

2. The semiconductor device of claim 1 further comprising conductive features, wherein the conductive features extend between the semiconductor die and the first side of the redistribution structure and electrically couple the semiconductor die to the first conductive contacts.

3. The semiconductor device of claim 1 wherein the conductive columns extend into the molded material to a height at least as high as a back surface of the semiconductor die.

4. The semiconductor device of claim 1 wherein the redistribution structure is a first redistribution structure, and further comprising a second redistribution structure on at least a portion of the molded material.

5. The semiconductor device of claim 4 wherein the second redistribution structure includes third conductive contacts electrically coupled to corresponding ones of the conductive columns.

6. The semiconductor device of claim 5 wherein the second redistribution structure includes fourth conductive contacts electrically coupled to corresponding ones of the third conductive contacts.

7. The semiconductor device of claim 6 wherein at least one of the fourth conductive contacts is positioned at least partly within a footprint of the semiconductor die.

8. The semiconductor device of claim 6, further comprising a plurality of conductive features disposed on the fourth conductive contacts.

9. The semiconductor device of claim 8 wherein the conductive features are at least one of solder balls and solder bumps.

10. The semiconductor device of claim 1 wherein the molded material fills a space between the semiconductor die and the first side of the redistribution structure.

11. The semiconductor device of claim 1 wherein the conductive columns each have an end portion exposed from the molded material and collectively define third conductive contacts.

12. The semiconductor device of claim 11, further comprising conductive features disposed on the third conductive contacts.

13. The semiconductor device of claim 12 wherein the conductive features are at least one of solder balls or solder bumps.

14. The semiconductor device of claim 1 wherein the first side of the redistribution structure includes a die-attach area under the semiconductor die, and wherein the second conductive contacts are outside of the die-attach area.

15. The semiconductor device of claim 1 wherein the first side of the redistribution structure includes a die-attach area under the semiconductor die, and wherein the first contacts are in the die-attach area.

16. A method of manufacturing a semiconductor device, the method comprising:
    forming a redistribution structure on a carrier, wherein the redistribution structure includes first conductive contacts and second conductive contacts electrically coupled to corresponding ones of the first conductive contacts, and wherein the redistribution structure does not include a pre-formed substrate;
    forming conductive columns having a first end portion and a second end portion, wherein the first end portions are electrically coupled to corresponding ones of the second conductive contacts;
    electrically coupling a semiconductor die to the first conductive contacts;
    forming a molded material on the redistribution structure, wherein the molded material at least partially surrounds the semiconductor die and the conductive columns, and wherein at least the second end portions of the conductive columns are exposed from the molded material; and
    removing the carrier.

17. The method of claim 16 wherein the redistribution structure includes a first side and a second side opposite the first side, wherein the second side faces the carrier and comprises a continuous layer of insulating material without any conductors therein.

18. The method of claim 16 further comprising:
    forming conductive features electrically coupled to corresponding ones of the first conductive contacts of the redistribution structure, and
    wherein electrically coupling the semiconductor die to the first conductive contacts comprises electrically coupling the semiconductor die to the conductive features.

19. The method of claim 16 wherein the redistribution structure is a first redistribution structure, and the method further comprises:
    forming a second redistribution structure on at least a portion of the molded material, wherein the conductive columns electrically couple the second redistribution structure to the first redistribution structure.

20. The method of claim 19 wherein the second redistribution structure includes third conductive contacts, and the method further comprises:

disposing a plurality of conductive features on the third conductive contacts.

21. A semiconductor device package, comprising:

a redistribution structure including first conductive contacts and second conductive contacts, wherein the first conductive contacts are electrically coupled to corresponding ones of the second conductive contacts, and wherein the redistribution structure does not include a pre-formed substrate;

a semiconductor die over the redistribution structure;

conductive features electrically coupling the semiconductor die to the first conductive contacts;

conductive columns electrically coupled to corresponding ones of the second conductive contacts; and a molded material on the redistribution structure and at least partially surrounding the semiconductor die, the conductive features, and the conductive columns, wherein at least a portion of the conductive columns are exposed to define a plurality of package contacts.

22. The semiconductor device package of claim 21 wherein the conductive columns have a height that is greater than a height of the conductive features.

23. The semiconductor device package of claim 21 wherein the semiconductor die is only electrically accessible through the package contacts.

24. The semiconductor device package of claim 21 wherein the package contacts are first package contacts, and further comprising a second redistribution structure at least partially on the molded material and having second package contacts electrically coupled to corresponding ones of the first package contacts.

25. The semiconductor device package of claim 24, further comprising solder balls disposed on the second package contacts.

* * * * *